United States Patent
Ikeya et al.

(10) Patent No.: US 6,614,247 B2
(45) Date of Patent: Sep. 2, 2003

(54) SOCKET APPARATUS AND METHOD FOR REMOVABLY MOUNTING AN ELECTRONIC PACKAGE

(75) Inventors: Kiyokazu Ikeya, Shizuoka (JP); Kyozo Katayose, Ichikawa (JP)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 10/012,864

(22) Filed: Oct. 22, 2001

(65) Prior Publication Data
US 2003/0076123 A1 Apr. 24, 2003

(30) Foreign Application Priority Data
Oct. 25, 2000 (JP) .................................. 2000-325171

(51) Int. Cl.[7] .............................................. G01R 31/02
(52) U.S. Cl. ..................................... 324/755; 324/158.1
(58) Field of Search ............................. 324/755, 158.1, 324/765, 758, 73.1, 743, 761, 762; 439/70, 71, 330, 66, 73, 266

(56) References Cited

U.S. PATENT DOCUMENTS

| | | | | |
|---|---|---|---|---|
| 6,124,720 A | * | 9/2000 | Pfaff et al. | 324/755 |
| 6,242,932 B1 | * | 6/2001 | Hembree | 324/755 |
| 6,313,651 B1 | * | 11/2001 | Hembree et al. | 324/755 |
| 6,369,595 B1 | * | 4/2002 | Farnworth et al. | 324/755 |

* cited by examiner

Primary Examiner—Kamand Cuneo
Assistant Examiner—Jimmy Nguyen
(74) Attorney, Agent, or Firm—Russell E. Baumann; Frederick J. Telecky, Jr.

(57) ABSTRACT

A socket (10) has a plurality of contacts (13) arranged in base (11). Each contact has one arm (13a) for contacting a solder ball of an electronic package (2). A slider (12) has a seat (12a) for package (2), a plurality of terminal receiving holes (12b), a terminal engagement surface (12c) formed at each terminal receiving hole for engagement with a respective solder ball and a plurality of contact receiving holes (12d). When slider (12) is moved in one directions package (2) can be seated with each ball disposed in a respective terminal receiving hole. When the slider returns, each ball is elastically contacted between an arm (13a) and a terminal engagement surface (12c).

15 Claims, 10 Drawing Sheets

SOCKET APPARATUS AND METHOD FOR REMOVABLY MOUNTING AN ELECTRONIC PACKAGE

FIELD OF THE INVENTION

This invention relates generally to sockets for removably mounting electronic packages, such as a package containing an integrated circuit, for conducting electrical tests of such packages and more particularly to such sockets in which each conductive terminal of an electronic package is electrically connected to a respective lead in the socket for further connection to testing equipment.

BACKGROUND OF THE INVENTION

IC (integrated circuit) packages in which an IC chip has been sealed by resin are typically subjected to a reliability test called a burn-in test to separate them into satisfactory and unsatisfactory products.

FIGS. 13(a)–13(d) show an example of a known socket 101 used in burn-in tests for electronic packages having BGA (Ball Grid Array) terminals. Socket 101 has a square-shaped base 102 in which are mounted a plurality of contacts 104 for a pressure connection of respective solder balls 100a of a BGA package 100. Contacts 104 are each made of an elongated metal member, with a pair of arms 104a and 104b being provided at one end thereof. A slider 105 capable of carrying BGA package 100 is mounted on base 102 for movement in the horizontal direction (X direction). Slider 105 is adapted to accommodate contacts 104 through contact receiving holes 105a. As shown in FIGS. 13(a), 13(b), respective ball receiving holes 105c for accommodating each solder ball 100a are formed on seat 105b of slider 105 in such a manner as to cross the contact accommodation hole 105a. As shown in FIG. 13(b), further, respective engagement parts 105d of slider 105 are formed inside of contact receiving holes 105a for engagement with arms 104a of respective contacts 104. A cover 106 for operating slider 105 is provided on base 102 for movement toward and away from base 102 through compression coil springs 107.

In a socket as described above, if cover 106 is pressed down, slider 105 moves in the X+ direction, causing arms 104a of contacts 104 to engage with engagement parts 105d of slider 105, thereby opening the contacts in the X+ direction in a bent state. When, in this state, the BGA package 100 is dropped onto seat 105b of slider 105, each solder ball 100a of BGA package 100 is accommodated in a respective ball receiving hole 105c. When cover 104 is raised, slider 105 is returned in the X– direction by the force of arms 104a of contacts 104. As a result, each arm 104a contacts a respective solder ball 100a and, at the same time, the other arm 104b bends in the X– direction as it is pushed by solder ball 100a. Each pair of arms 104a and 104b sandwich a solder ball 100a, so that each solder ball 100a of the BGA package is electrically connected to a contact 104.

In the above arrangement, arms 104a and 104b move in connection with the opening of arms 104a and the holding of the solder ball 100a by both arms 104a and 104b. Accordingly, it has been necessary to provide an area large enough to conform to the amount of movement of arms 104a and 104b in seating portion 105b of slider 105. Since there is a physical limitation as to how close contacts 104 can be arranged, it has been difficult to use a conventional socket 101 for BGA packages having solder balls that have been arranged in finer pitches.

SUMMARY OF THE INVENTION

It is an object of the present invention to solve the above noted problems of the prior art. Another object of the invention is the provision of a socket which is adaptable for use with IC packages of finer pitches.

Briefly described, a socket made in accordance with a preferred embodiment of the invention for removably receiving an electronic part having terminals arranged according to a selected pattern comprises a socket base having a plurality of contacts arranged corresponding to the selected pattern, each having a cantilever-like contact arm capable of contacting a terminal of an electronic part. A slider capable of moving in a horizontal direction relative to the socket base is slidably mounted on the base and has a plurality of contact receiving through-holes that correspond to the positions of the contact arms. The walls of the through-holes are arranged so that they apply no bias to the contact arms allowing them to function as free ends. The slider is also formed with terminal receiving holes for accommodating the terminals and which communicate with the through-holes. The terminals can be accommodated in the terminal receiving holes when the slider is at a selected position and the arms can be flexibly connected with the terminals in the terminal receiving holes when the slider is at another selected position.

According to a feature of the invention, the contacts are each formed with a single contact arm rather than the conventional pair of squeezable arms and the terminals of the electronic part are engaged in the terminal receiving holes upon movement of the slider, thereby making it possible to connect each respective terminal of the electronic part by holding such terminal between a wall, i.e., a terminal engagement surface in a terminal receiving hole, and an arm of a contact. Accordingly, only enough space need be provided on the slider which corresponds to the range of movement required for the terminals of the electronic part to be connected with the arms of the contacts under a suitable force so that the area that the contact arm occupies on the slider seat can be smaller than that provided in the prior art. As a result, terminals with a finer pitch can be accommodated. According to another feature of the invention, a cover is provided which is capable of moving in a direction toward or away from the socket base. The cover has an engagement portion capable of engaging the slider to move the slider in a selected direction as the cover moves toward or away from the socket base when the engagement portion is in engagement with the slider. In accordance with the invention, the contacts are bent only when they are engaged with terminals of the electronic part, thereby enhancing the durability of the contacts. According to another feature of the invention, the terminal engagement surface of the terminal receiving hole can be a cylindrical surface or it can be configured in greater conformity with the surface shape of the terminals of the electric part with which the socket is used, e.g., partly spherical for solder ball terminals.

According to a feature of the invention, the contacting portion of the contact arms can be formed with projections, for example, in the shape of a claw having a pair of spaced apart projections extending in selected directions so that when mounted they extend toward the terminal engagement surfaces. Thus, the contacts can be stably connected with the terminals of the electronic part in a contact area that correspond to the contact area of a plurality of arms even when a single arm is employed.

According to yet another feature, the contacting portions of the contact arm are arranged to contact the root portion of the terminals on the side of the electronic part from which the terminals extend. When used with electronic parts having a BGA package with globular terminals, the contacting portion of the contact arms engage the terminals between the bottom surface of the package and that portion of the terminals where the diameter becomes the largest relative to planes parallel to the bottom surface of the package.

According to another feature of an embodiment of the invention, a jig having a holding and releasing part for delivery of an electronic part is movable toward and away from the socket and can be used to move the cover or the slider of a socket having no cover.

Additional objects and features of the invention will be set forth in part in the description which follows and in part will be obvious from the description. The objects and advantages of the invention may be realized and attained by means of the instrumentalities, combinations and methods particularly pointed out in the appended claims.

BRIEF DESCRIPTION OF THE DRAWINGS

The accompanying drawings, which are incorporated in and constitute a part of the specification, illustrate preferred embodiments of the invention. In the drawing.

DETAILED DESCRIPTION OF THE PREFERRED EMBODIMENTS

Figure 1:
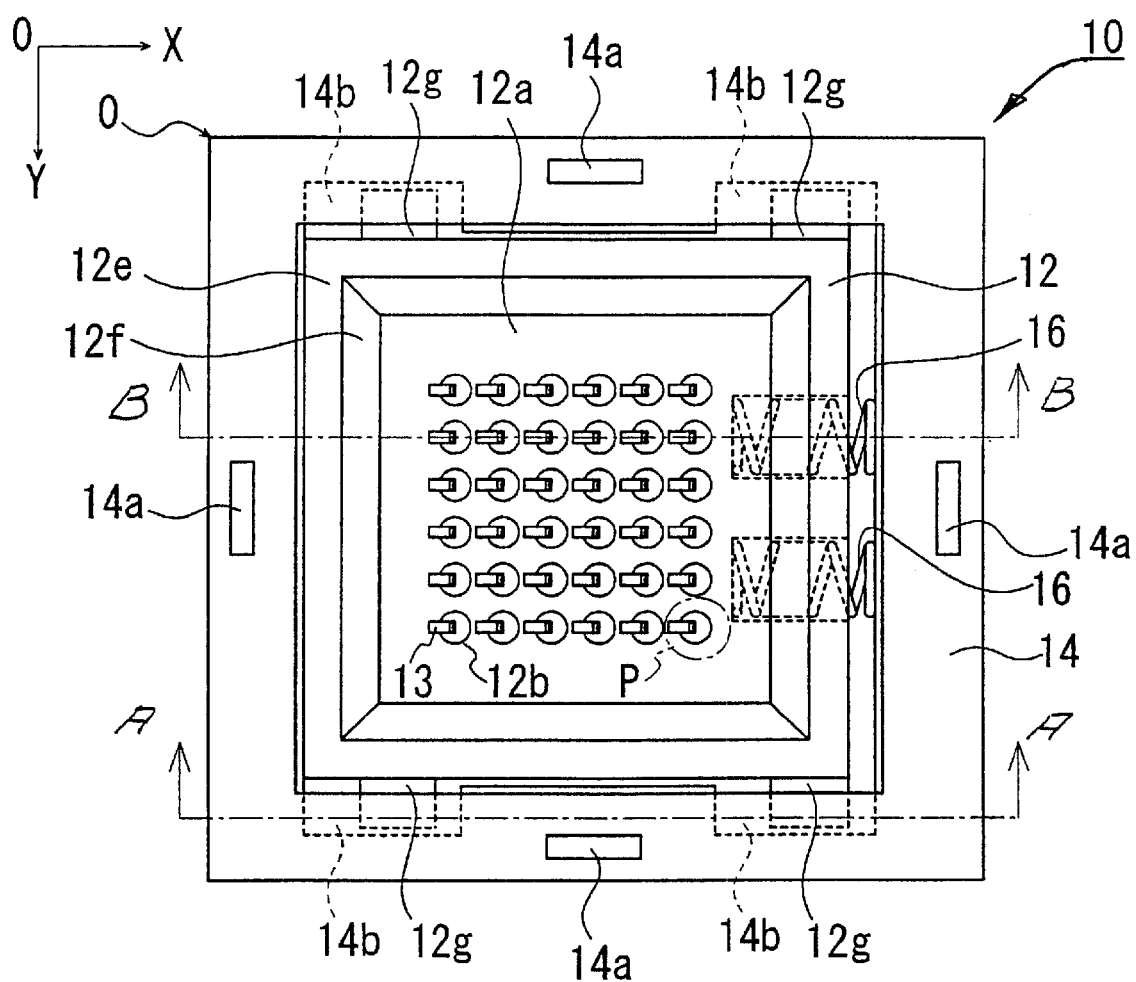
FIG. 1 is a top plan view showing the basic construction of a socket according to a first preferred embodiment of the invention.
Figure 2:
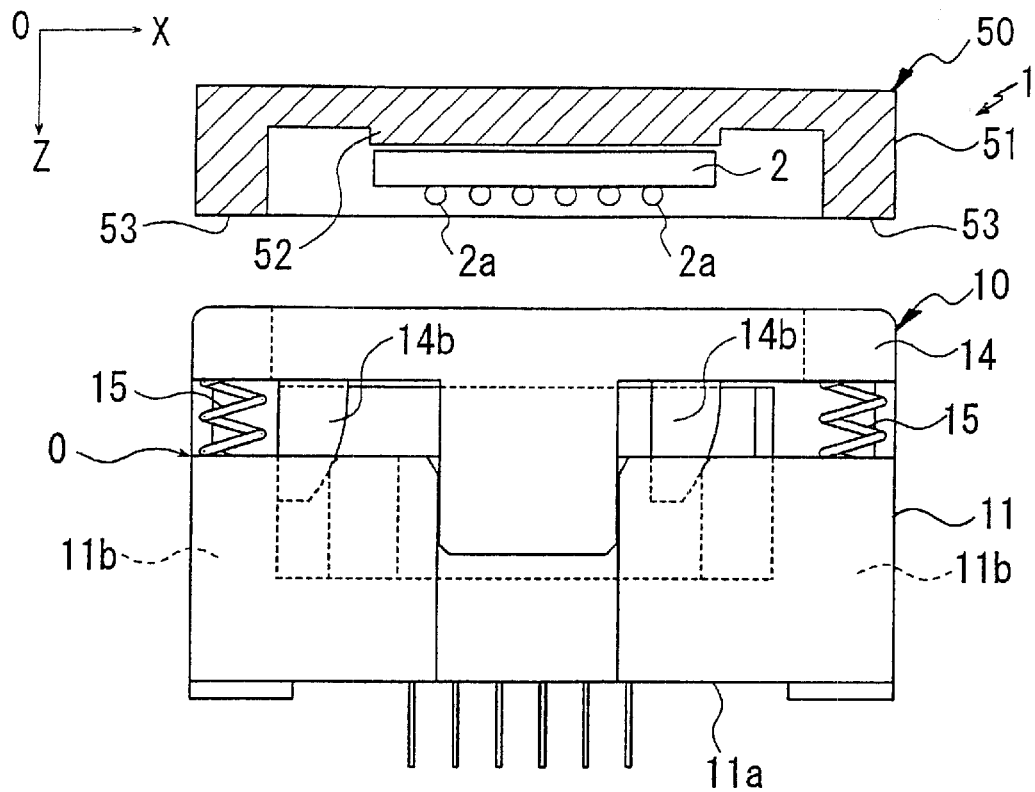
FIG. 2 is a front elevational view showing the FIG. 1 socket and an electronic part holding jig, the jig shown in cross section.
Figure 4:
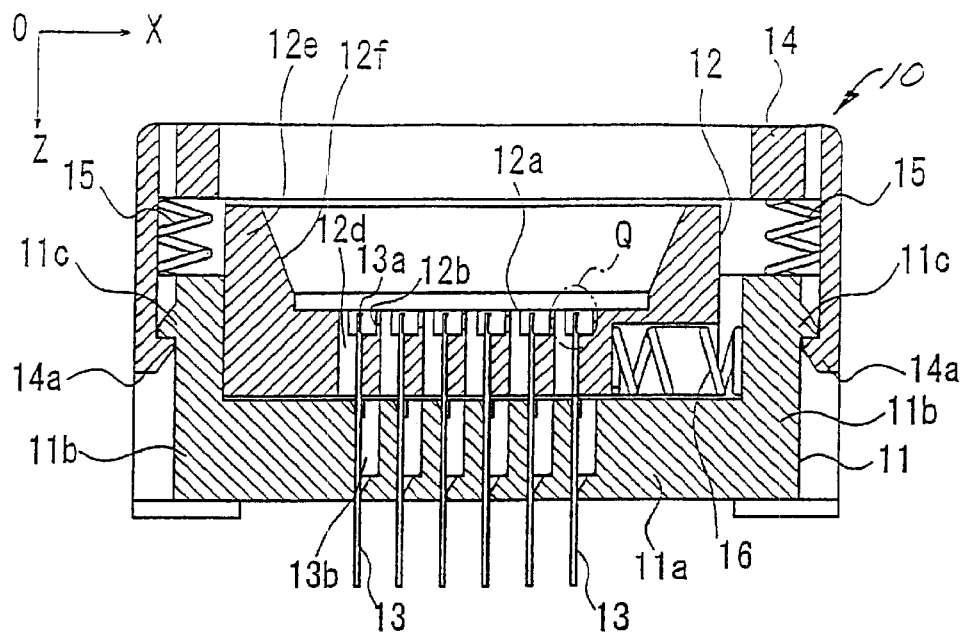
FIG. 4 is a cross sectional view taken on line B—B of FIG. 1.

As shown in FIG. 2, the electronic part mounting device 1 of this preferred embodiment is for mounting a BGA package (an electronic part, to be called "package") on which globular solder balls (terminals) 2a have been arranged according to a selected pattern. The mounting device comprises a socket 10 and a jig 50 disposed in aligned relationship with socket 10 for moving the slider of the socket. Socket 10 has a main socket body or base 11 composed of suitable resinous material, such as polyether imide, and a cover 14 having a centrally disposed electronic part access opening and capable of vertical movement toward and away from base 11. Base 11 is adapted to be fixed on a wiring substrate such as a printed substrate (not shown in the drawing). The base has a bottom 11a, generally square in shape, and a wall 11b that surrounds bottom 11a and with which forms a central space or cavity. A large number of elongated contacts 13 are provided at the bottom 11a of base 11 in conformity with the pattern of solder balls 2a of package 2, as shown in FIGS. 1 and 4. A protruding anchor portion 13b (see FIG. 4) is formed intermediate to the ends of contacts 13, and, as anchor portions 13b are received in the openings of base 11, the contacts are fixed in an upright state extending in a perpendicular direction relative to the bottom of base 11.

In contradistinction with conventional technology, the cantilever tip portion of each contact 13 does not have a pair of arms movable toward and away from each other. In the present embodiment, each contact 13 is provided with an arm 13a which can be elastically deformed in one prescribed direction with each contact arranged so that the direction in which arm 13a is deformed will be parallel to the direction of one side of the base 11 (direction X in FIG. 1).

With reference to FIG. 1, the horizontal direction is called herein the X direction and the direction perpendicular thereto is called the Y direction. The direction perpendicular to the X and Y directions is called the Z direction.

Figures 5A, 5B:
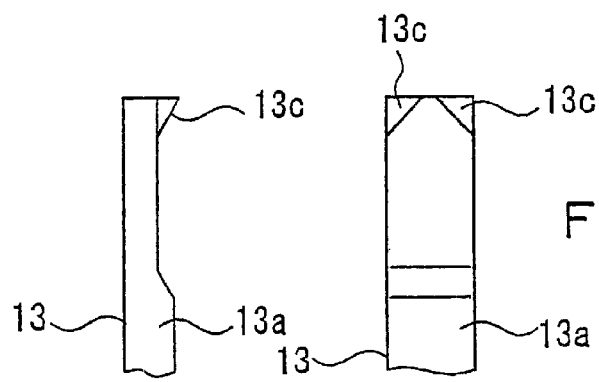
FIGS. 5(a), 5(b) are an enlarged, fragmented front and side elevational views, respectively, of the tip part of the contact of the FIGS. 1–4 socket.
Figure 5C:
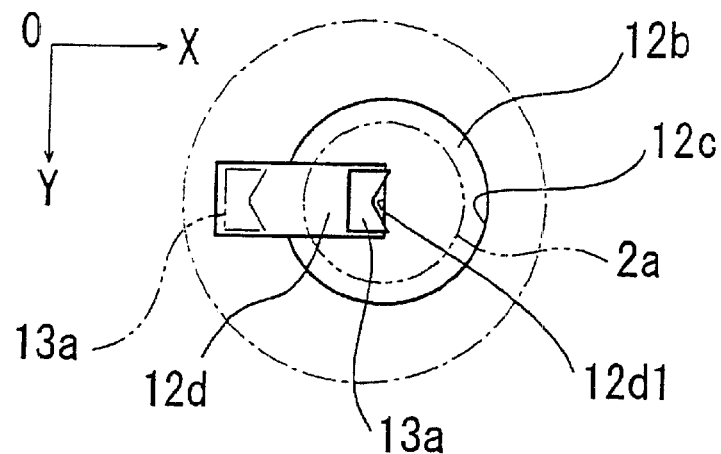
FIG. 5(c) is an enlarged top plan view showing the positional relationship among the contact, the terminal receiving hole and the contact receiving hole at P in FIG. 1.
Figure 5D:
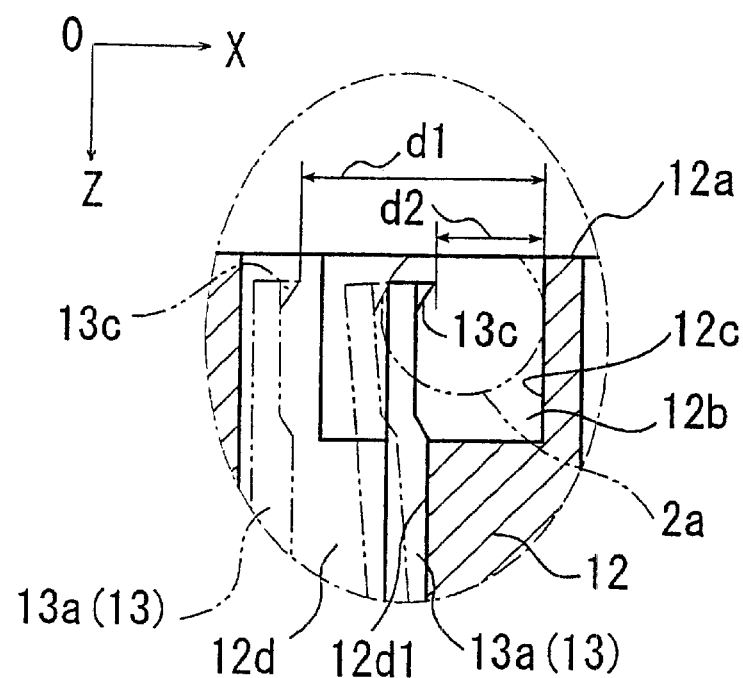
FIG. 5(d) is an enlarged, broken away, front elevational view showing the positional relationship among the contact, the terminal receiving hole and the contact receiving hole at Q in FIG. 4.

With reference to FIG. 1 or FIG. 4, a slider 12 is provided in the space above the bottom portion 11a of base 11 and is adapted for sliding movement on the bottom portion 11a in the X direction between first and second extremities. A flat carrying part or seat 12a is formed on the surface of slider 12 where a package 2 can be placed. A large number of terminal receiving holes 12b capable of accommodating solder balls 2a of the package are provided in seat 12a in conformity with the particular solder ball pattern of package 2. As shown in FIGS. 5(c) and 5(d), each terminal receiving hole 12b is cylindrically shaped so as to be able to form a terminal engagement surface 12c. The diameter of hole 12b is larger than the outer diameter of balls 2a and its depth is greater than the height of the solder balls. Contact receiving holes 12d are formed in slider 12 for accommodating contacts 13 in conformity with the position of each contact 13 extending from base 11 and each contact receiving hole 12d merges with and communicates with a respective terminal receiving hole 12b. Each contact receiving hole 12d is a through-hole, rectangular in shape, having its longitudinal side extending in the X direction of slider 12. Arm 13a of each contact is positioned in a through-hole 12d and is relatively movable to a position inside a respective terminal receiving hole 12b. The length of each contact receiving hole 12d in the X direction is either approximately equal to or slightly greater than the amount of movement of slider 12. Each contact 13 is adapted to maintain its erect upright orientation extending from base 11 without touching the side of slider 12 throughout movement of the slider in the X direction.

Arm 13a of each contact 13 is accommodated in a contact receiving hole 12d and arranged in opposition to the terminal engagement surface 12c of terminal receiving hole 12b. As shown in FIGS. 5(a), 5(b), a contact claw 13c, capable of engaging a part of the surface of the solder ball 2a, is formed with an acute angle at the tip of arm 13a by branching in two selected directions on the XY surface but generally toward the terminal engagement surface when the contact is mounted in the base.

As shown in FIG. 5(d), the distance d2 in the X direction between a contact claw 13c of contact 13 and a respective terminal engagement surface 12c of slider 12 is set at a value which is smaller than the diameter of solder balls 2a when the slider is at one extremity (with the contacts in a closed position). When slider 12 has been moved by a prescribed amount in X+ direction, the terminal receiving holes 12b of the slider 12 are opened, with the result that the distance becomes d1, a distance greater than the diameter of solder balls 2a. When slider 12 is moved in X− direction, with solder balls 2a being accommodated in terminal receiving holes 12b, the solder balls are elastically held between the terminal engagement surfaces 12c and the contact claws 13 of contacts 13. Moreover, contacts 13 are capable of producing a suitable force, depending upon their shape and the material used therefor. In addition, it is possible to set the force transferred through contact claws 13c at a value suitable for piercing solder balls 2a.

Regarding the relationship between the position of contact claws 13c of contacts 13 in the Z direction and the height of seat 12a of slider 12, it is preferred that contact claws 13c be arranged to be somewhat above the central part of solder balls 2a so that the contact claws can engage the root part of solder balls 2a, that is, that part between the area where the solder balls 2a have their largest diameter in a plane parallel to the bottom surface of package 2 and the location of the connection of the solder balls with the package.

As shown in FIG. 1 or FIG. 4, a guide wall portion 12e on the outer peripheral part of seat 12a of slider 12 is provided with a guide surface 12f inclined to lead a package 2 to seat 12a.

Figure 3:
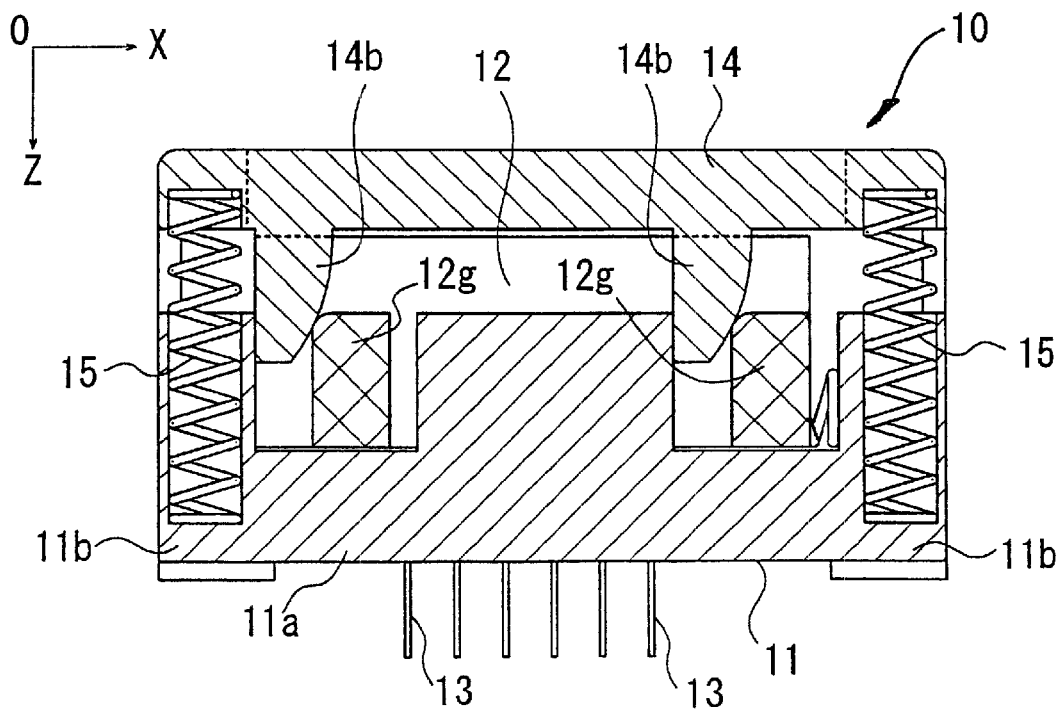
FIG. 3 is a cross sectional view taken on line A—A of FIG. 1.

As seen in FIG. 4, cover 14 has a motion limiting engagement member 14a extending in the Z direction on two opposing sides and being formed with a catch at the distal end thereof. The catch of each member 14a is engaged with an engagement protrusion 11c formed on base 11 to limit motion of the cover away from the base. Cover 14 is adapted to move toward base 11 until its lower surface touches the top surface of wall 11b of the base. With reference to FIG. 3, a plurality of cam members 14b having a selected surface such as a curved convex surface, as shown, are provided at each corner of cover 14 for moving slider 12. In cooperation with the cam members, follower engagement parts 12g are provided on the outer periphery of slider 12 for engaging cam members 14b of the cover. A plurality of first compression coil springs 15 having longitudinal axes extending in the Z direction are provided between cover 14 and base 11. When there is no externally applied force on cover 14, the force from the first compression coil springs 15 moves the cover to the raised position with the catch of engagement members 14a engaged with the engagement protrusions 11c of base 11. A plurality of second compression coil springs 16 having longitudinal axes extending in the X direction are provided between slider 12 and base 11. When no external force is applied on the cover and with the force from each of the second compression coil springs 16 in the X− direction, slider 12 engages wall 11b on the X− side of the base and follower engagement parts 12g of slider 12 engage with cam members 14b of cover 14.

As shown in FIG. 2, a jig 50 for operating the slider has a head 51 movable toward and away from socket 10 in the Z direction and has an engagement surface 53 formed on the socket 10 side of the jig adapted for engagement with cover 14. A holding part 52 is installed in the head capable, when desired, of holding package 2 by suitable means, such as suction.

Figure 6:
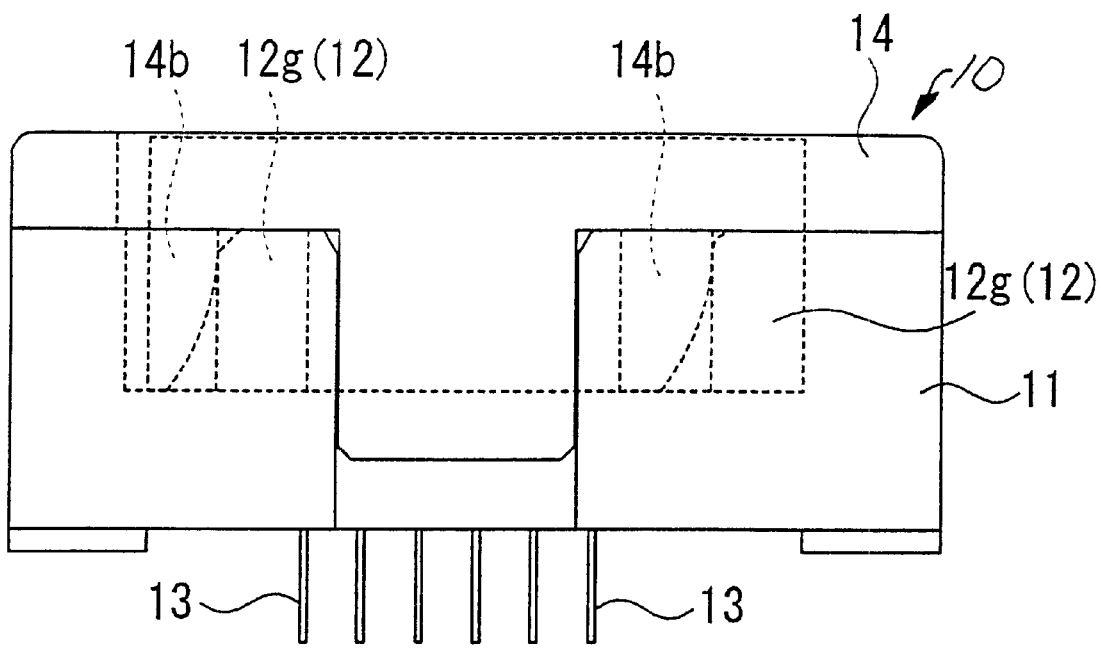
FIG. 6 is a front elevational view showing the socket with the cover in the lowered position.

In the embodiment described above, jig 50 holding a package 2 is lowered in the Z+ direction, thereby causing the engagement surface 53 of the jig to engage cover 14. Continued downward motion of the jig causes cover 14 to move in Z+ direction in opposition to the force provided by first compression coil springs 15 and second compression coil springs 16, until cover 14 comes into engagement with base 11 as shown in FIG. 6. As cover member 14 descends, follower engagement parts 12g are cammed by cam portions 14b of the cover member, thereby causing slider 12 to move in the X+ direction in opposition to the force of second compression coil springs 16.

Figure 7:
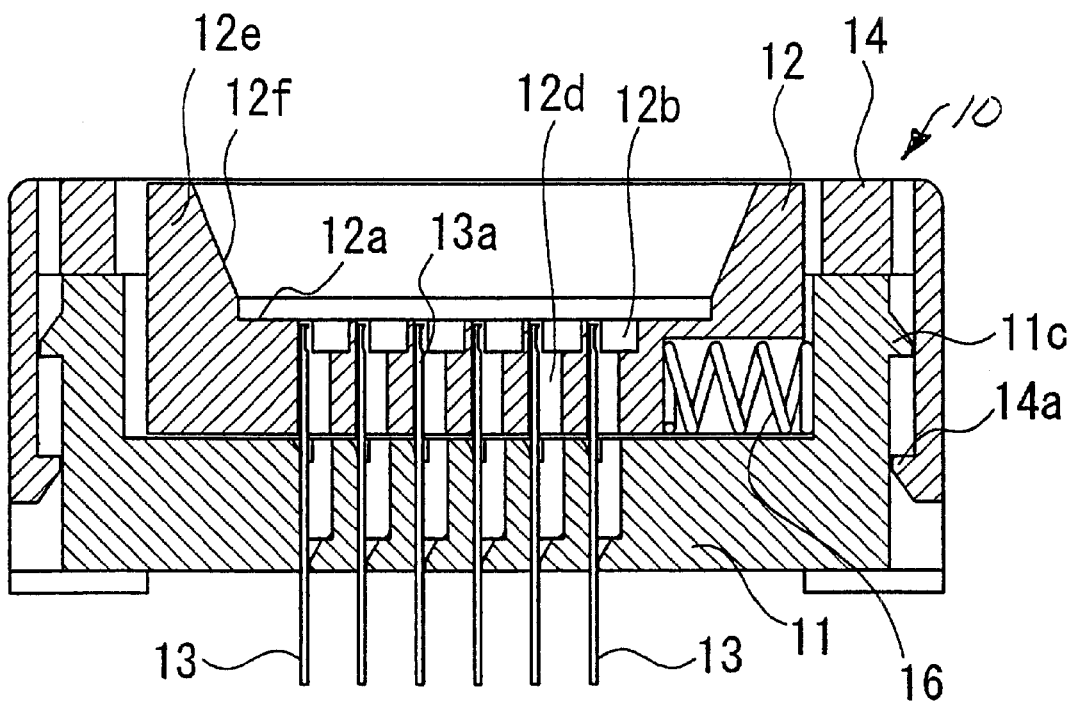
FIG. 7 is a cross sectional view taken through FIG. 6.
Figure 8:
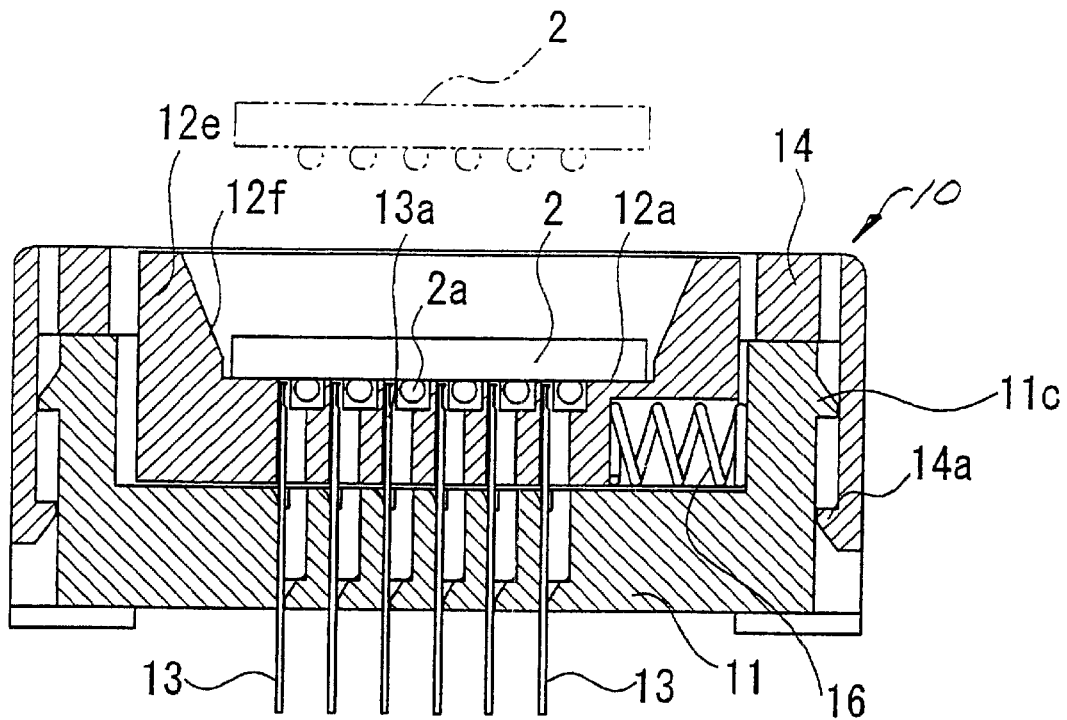
FIG. 8 is a cross sectional view similar to FIG. 6 but shown with an electronic part in dashed lines above the socket and in solid lines mounted in the socket.
Figure 10A:
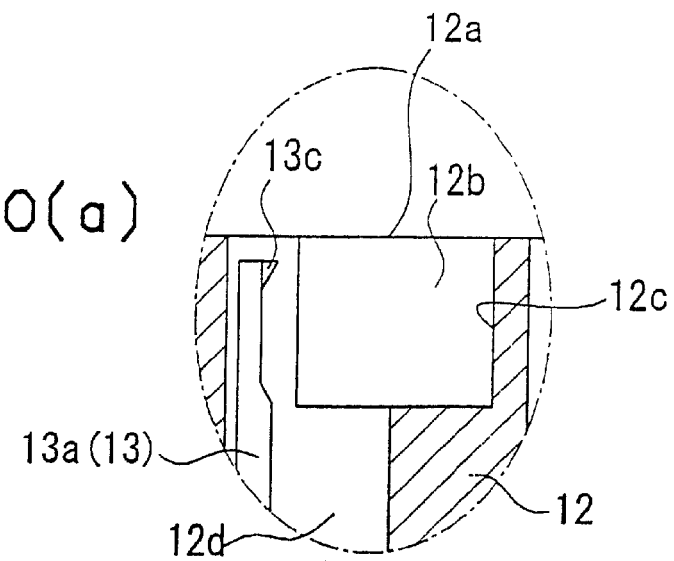
FIG. 10(a) is an enlarged, broken away, front elevational view showing the positional relationship among the contact, the terminal receiving hole and the contact receiving hole of FIG. 7.
Figure 10B:
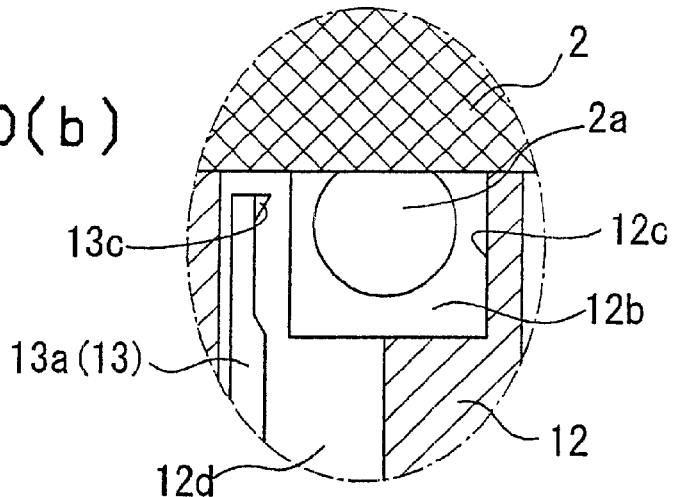
FIG. 10(b) is an enlarged, broken away, front elevational view showing the positional relation among the contact, the terminal receiving hole and the contact receiving hole shown in FIG. 8.

As shown in FIGS. 7 and 10(a), when the slider has moved to the extreme X+ position contacts 13 are relatively moved away from terminal receiving holes 12b to a position solely inside contact receiving holes 12d, while maintaining the upright, erect orientation extending from base 11, thereby opening the terminal receiving holes 12b. With the slider in the FIG. 7 position, and as shown in FIG. 8, package 2 is then released from jig 50, thereby dropping package 2 onto seat 12a of slider 12. Package 2 is guided onto seat 12a of the slider along the guiding surface 12f and each solder ball 2a of the package 2 is accommodated in a terminal receiving hole 12b as seen in FIG. 10(b).

Figure 9:
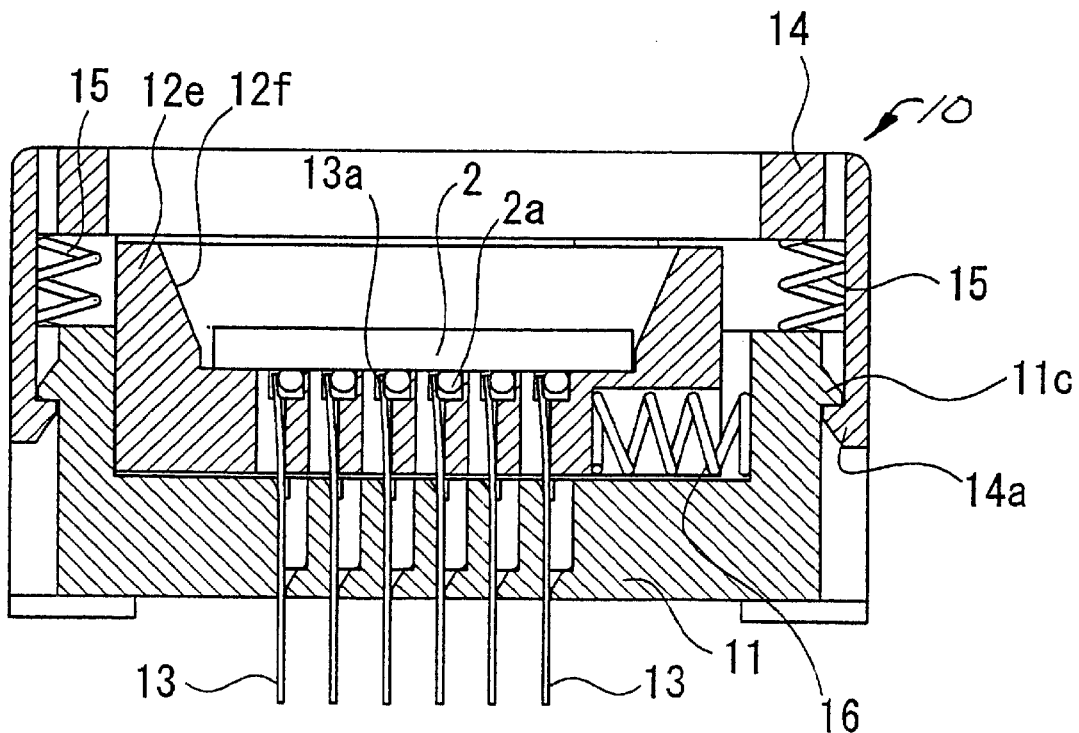
FIG. 9 is a cross sectional view similar to FIG. 7 but shown with the cover in the raised position.
Figure 10C:
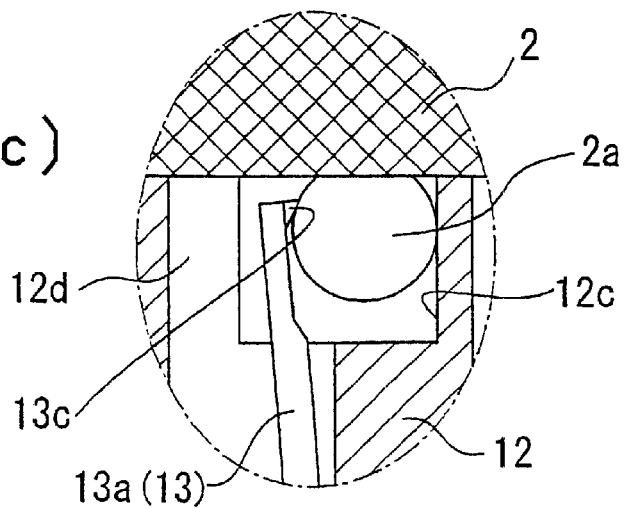
FIG. 10(c) is an enlarged, broken away, front elevational view showing the positional relation among the contact, the ball receiving hole and the contact receiving hole shown in FIG. 9.

When jig 50 is then raised in the Z− direction, slider 12 is returned in the X− direction due to the force of second compression coil springs 16 with the slider engaging wall 11b on the X− side of the base and cover member 14 is moved in the Z− direction, as seen in FIG. 9. At this stage, solder balls 2a in the terminal receiving holes 12b are held, as shown in FIG. 10c, between contact claws 13c and a respective terminal engagement surface 12c that relatively approach each other.

In situations where the solder balls 2a happen to be disposed away from the central part on the XY plane of the terminal receiving hole 12b, the position of the solder balls 2a are somewhat adjusted as they are guided by the terminal engagement surfaces 12c, while approaching the contact claws 13c, thereby orienting them along a straight line between a respective contact claw 13c and the terminal engagement surface 12c in the X direction. Contact arms 13a bend by a predetermined amount as they are pushed by the solder balls 2a in the X− direction. Contact claws 13c engage the root part of the surface of the solder balls 2a with a spring force dependent upon the amount of bending of arms 13a, with a consequence that contacts 13 are effectively connected electrically with respective solder balls 2a.

According to the present embodiment, solder balls 2a of package 2 are pressed against respective contacts 13 which are anchored in the base, while the solder balls are guided by the terminal engagement surfaces 12c of slider 12. Therefore, it becomes possible to accurately position the solder balls against the contact claw 13c of each respective contact 13, irrespective of the position at which the solder balls 2a have been arranged inside the terminal receiving holes 12b of slider 12.

According to the embodiment described above, each contact 13 has one arm 13a and a solder ball 2a of package 2 is pressed against the arm upon movement of slider 12. Accordingly, it is only necessary to provide enough space to accommodate the range of movement required for bending of the arm by the predetermined amount, thereby making it possible for the area occupied by arm 13a of each contact on seat 12a of the slider to be reduced as compared with the prior art. In view of the fact that contacts 13 can be arranged in closer proximity with one another as described above, the socket can be adapted for use with a package 2 that has solder balls 2a arranged closer together than can be accommodated in conventional sockets.

In the embodiment described above, since each contact has only one arm, the construction of contact 13 itself can be simplified and, along with this, the part of the slider that accommodates contact 13 can be simplified, i.e., that part required for the engagement of the contacts according to the prior art described supra becomes unnecessary. Thus, it becomes possible to simplify the construction of slider 12 itself and the cost of the metal molds which are used in the preparation of contact 13 and slider 12 can be reduced.

According to the above described embodiment, arms 13a are bent only when they are connected to solder balls 2a. Accordingly, it becomes possible to set the amount of bending of arms 13a at a desired selected value, based on the amount of movement of slider 12 and the position for the engagement of solder balls 2a. As a result of this, it becomes possible to connect arms 13a and respective solder balls 2a with a suitably compressive force and, at the same time, improve the durability of the contacts to a greater degree than in the case of prior art contacts. As noted above, typically, prior art contacts are stressed during the opening operation of the contacts as well as in the connected state. According to the present invention, a minimum required stress corresponding to the amount of bending is produced only in the connected state.

Further, according to this embodiment, the portion of the contacts that engage the solder balls 2a has the shape of a bifurcated claw. Such contacts can stably engage solder balls 2a in an engagement pattern which is equivalent to two arms despite the fact that only one arm 13a is used.

Still further, according to this embodiment, the contact claws 13c are caused to engage or pierce the root part of solder balls 2a. As the solder balls 2a receive contact claws 13c at that part of the solder balls that are connected to package 2, it thus becomes possible to control the amount of deformation of the solder balls 2a that is produced in this connection. This will be especially effective in the case where the solder balls 2a are heated and become relatively soft. Excessive piercing by contact claws 13c can be prevented by adjusting the position of parts 12c that engage solder balls 2a in the terminal receiving holes 12(b).

Figures 11A, 11B, 11C, 11D:
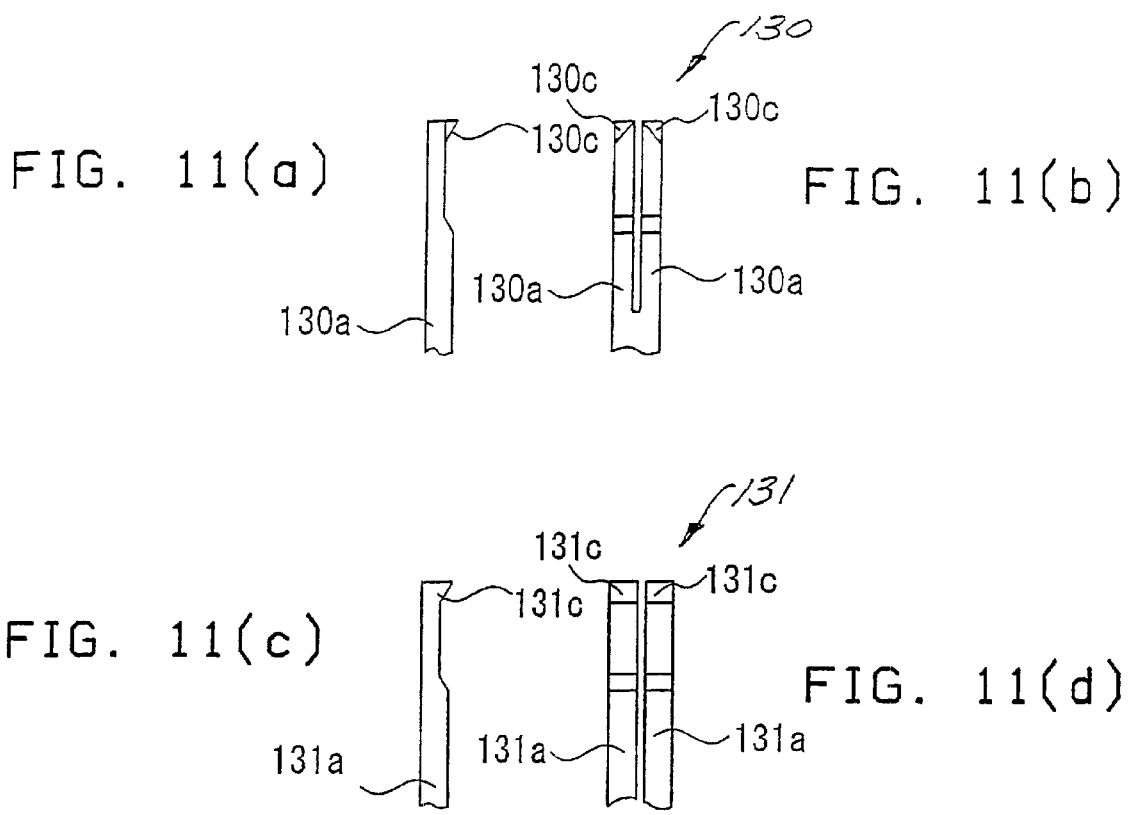
FIGS. 11(a), 11(b) and 11(c), 11(d) are enlarged, fragmented front and side elevational views, respectively, showing the contact claws of other contacts according to the invention.

FIGS. 11(a)–11(d) show the contact claws of other contacts made according to the invention. As shown in FIGS. 11(a), 11(b), the tip part of arm 130a of contact 130 is partially divided, with a contact projection or claw 130c being provided at each respective tip part. As shown in FIGS. 11(c), 11(d), the entire arm 131a of contact 131 can be divided with a contact projection claw 131c being provided at each tip part. It thus becomes possible to increase conditions required for the determination of the amount of the bending suitable for the arm, thereby obtaining an optimal value.

Figure 12:
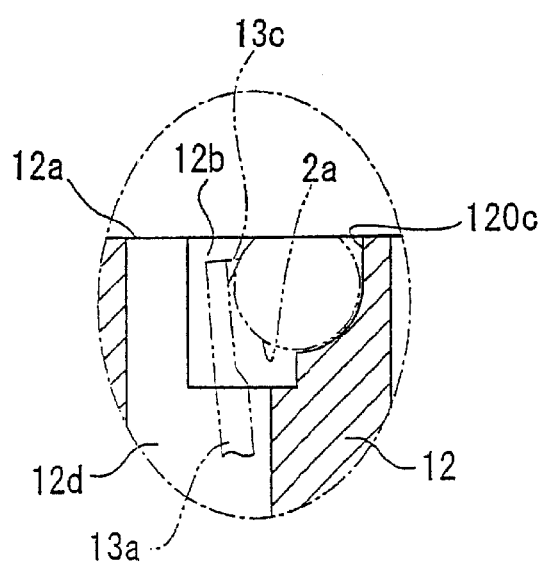
FIG. 12 is an enlarged, broken away front elevational view showing the terminal engagement surface of a modified slider according to the invention.
Figure 13A:
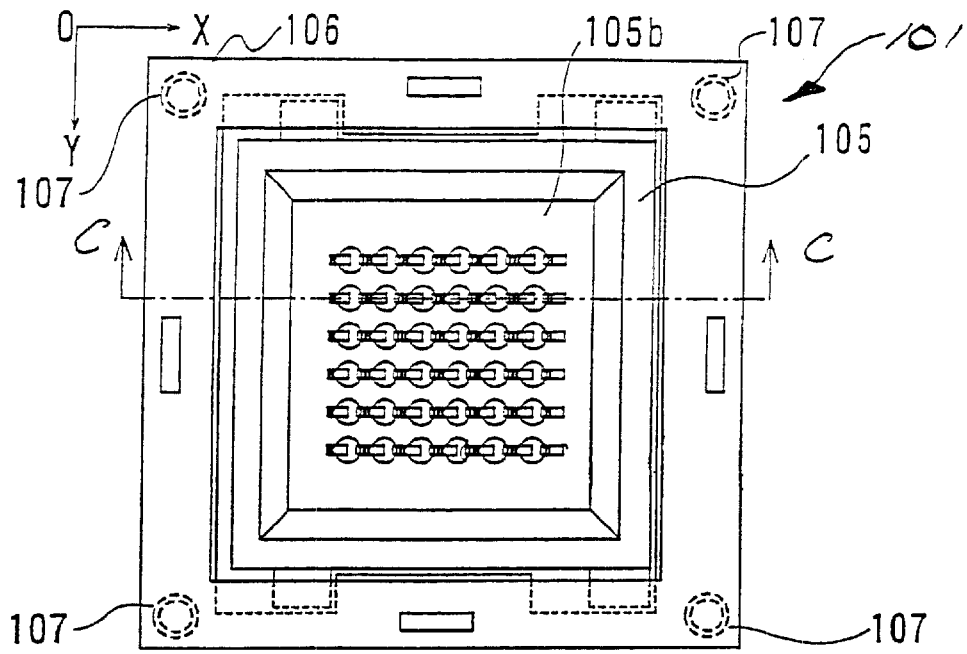
FIG. 13(a) is a top plan view of a socket made in accordance with the prior art.
Figure 13B:
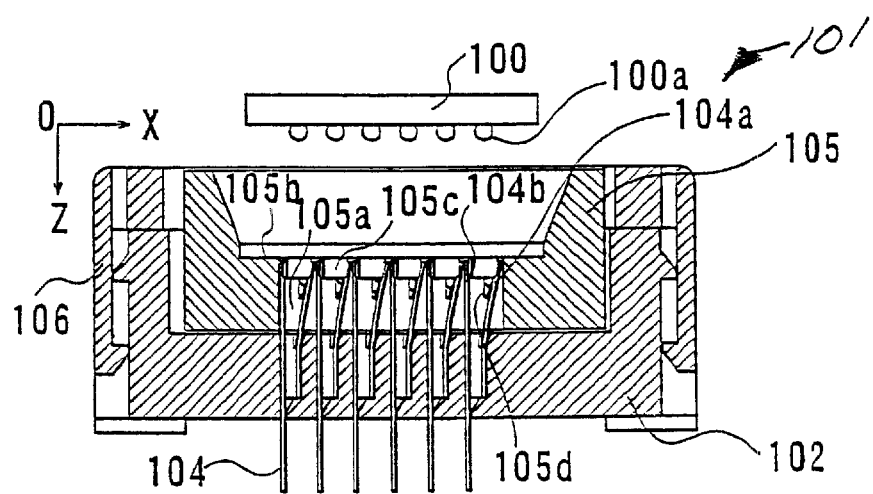
FIG. 13(b) is a cross sectional view taken on line C—C of FIG. 13(a) shown with an electronic part about to be mounted.
Figure 13C:
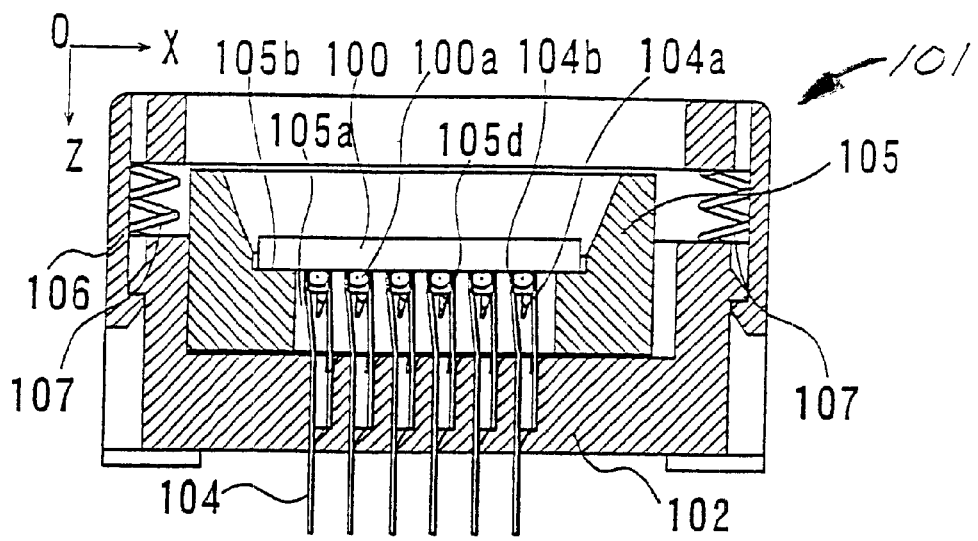
FIG. 13(c) is a view similar to FIG. 13(b) but shown with the electronic part received in the socket.
Figure 13D:
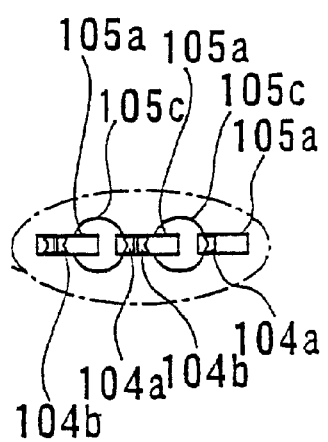
FIG. 13(d) is an enlarged portion of FIG. 13(a).

FIG. 12 shows the terminal engagement surface of another slider made according to the invention. As shown in FIG. 12, terminal engagement surfaces 120c of the slider can be formed in a partially spherical shape in which the curvature is approximately the same as the curvature of solder balls 2a. Accordingly, the solder balls can be positioned more accurately as compared with the cylindrical surface 12c and moreover, it also becomes possible to enhance the control of the amount of deformation of solder balls 2a.

In the above described embodiments, an example of a socket provided with a cover has been shown. It should be noted that the invention can be used as well for uncovered sockets. In such case, a jig 50 can be provided which includes cam portions 14b of cover member 14 for engagement with the follower engagement part 12g of slider 12.

Further, in the above embodiments, an example of a socket of the type in which the slider moves back and forth in the X direction on the base has been shown. However, the invention can be used as well in a socket of the type where the slider moves back and forth along a diagonal line of the base. Although the invention has been described with regard to specific preferred embodiments thereof, other variations and modifications will become apparent to those skilled in the art. It is therefore, the intention that the appended claims be interpreted as broadly as possible in view of the prior art to include all such variations and modifications.

What is claimed:

1. Socket apparatus for removably receiving an electronic package having a plurality of terminals extending downwardly from the package and arranged in a selected pattern comprising:

an electrically insulative base having top and bottom surfaces and having a plurality of contact receiving holes extending therethrough between the top and bottom surfaces and arranged in the selected pattern, an electrically insulative slider having top and bottom surfaces slidably received on the top surface of the base for movement along a straight line between first and second extremities on the base, an electronic package receiving seat formed on the top surface of the slider, a contact receiving hole formed through the slider between the top and bottom surfaces for each contact receiving hole in the base and being alignable therewith, a terminal receiving hole having a terminal engagement surface formed through the top surface of the slider for each contact receiving hole in the slider, each terminal receiving hole in the slider being merged with the respective contact receiving hole in the slider for communication therebetween, an elongated electrically conductive contact received and retained in each contact receiving hole of the base and extending through a respective contact receiving hole in the slider, each contact having a free distal tip disposed adjacent to the top surface of the slider, the slider being movable between a first position in which the contacts are disposed a first distance from respective terminal engagement surfaces and a second position in which the contacts are disposed a second, greater distance from respective terminal engagement surfaces, whereby an electronic package having a plurality of terminals arranged in the selected pattern can be placed on the electronic package receiving seat with the terminals received in respective terminal receiving holes when the slider is in the second position and when the slider is in the first position the terminals in the terminal receiving holes are sandwiched between and in engagement with respective terminal engagement surfaces and contacts.

2. Socket apparatus according to claim 1 in which the contacts are out of engagement with the slider throughout the range of movement of the slider.

3. Socket apparatus according to claim 1 in which the free distal tips of the contacts are disposed below the top surface of the slider.

4. Socket apparatus according to claim 1 in which the contacts are formed with an anchor portion for fixedly mounting the contacts in respective contact receiving holes in the base and each contact is formed with a contact arm extending upwardly into a respective contact receiving hole in the slider.

5. Socket apparatus according to claim 1 further comprising two spaced apart projections formed on the free distal tip of each contact arranged to face a respective terminal engagement surface.

6. Socket apparatus according to claim 4 in which the free distal tip of each contact arm is bifurcated and a projection is formed on each bifurcation arranged to face a respective terminal engagement surface.

7. Socket apparatus according to claim 4 in which each contact arm is bifurcated and a projection is formed on the free distal tip of each bifurcation arranged to face a respective terminal engagement surface.

8. Socket apparatus according to claim 1 adapted for use with electronic packages having a bottom surface and having solder ball terminals, the solder ball terminals having diameters which vary in size up to a maximum relative to directions parallel to the bottom surface of the electronic packages further comprising two spaced apart projections formed on the free distal tip of each contact arranged to face a respective terminal engagement surface, the projections disposed below the top surface of the slider a distance less than the distance from the maximum diameter of the solder ball terminals to the bottom surface of the electronic packages.

9. Socket apparatus according to claim 1 in which the terminal engagement surface is generally cylindrical.

10. Socket apparatus according to claim 1 in which the terminal engagement surface is partially spherical.

11. Socket apparatus according to claim 1 further comprising first spring members mounted in the base placing a bias on the slider toward the first position.

12. Socket apparatus according to claim 1 further comprising spring members mounted in the base placing a bias on the slider toward the first position and follower engagement surfaces are formed on the slider and a cover having a centrally formed electronic package access opening is mounted on the base movable toward and away from the top surface of the base, the cover formed with downwardly extending cam portions aligned with respective follower engagement surfaces, second spring members mounted in the base for placing a bias on the cover in a direction away from the base, the cover being movable toward the base against the bias of the second spring members with the cam members adapted to engage the follower engagement surfaces and move the slider toward the second position against the bias of the first spring members.

13. Socket apparatus according to claim 12 further comprising a jig movable toward and away from the socket having an electronic package holding and releasing portion aligned with the electronic package access opening of the cover, the jig having a cover engagement surface so that movement of the jig toward the socket will result in engagement of the cover engagement surface with the cover and continued movement of the jig will cause the cover to move toward the base and concomitantly cause the cam portions to cam the follower engagement surfaces and cause sliding movement of the slider.

14. A method comprising the steps of mounting a plurality of spaced apart, elongated electrical contacts in a base with the contacts each having a cantilever contact arm extending generally upright from a top surface of the base into a respective contact receiving hole bounded in part by a terminal engagement surface in a slider slidably mounted on the top surface of the base, moving the slider away from a first position against the bias of a spring force so that each terminal engagement surface moves away from the contact arm in the respective contact receiving hole to a second position allowing terminals of an electronic package to be placed between the terminal engagement surfaces and respective contact arms, and allowing the spring force to move the slider in a return, opposite direction to the first position pushing the terminals by the terminal engagement surfaces into engagement with the contact arms.

15. A method according to claim 14 including the step of maintaining clearance between the slider and the contact arms during movement of the slider.

\* \* \* \* \*